United States Patent [19]

Routh et al.

[11] 4,437,961

[45] Mar. 20, 1984

[54] METHOD FOR SEQUENTIALLY PROCESSING A MULTI-LEVEL INTERCONNECT CIRCUIT IN A VACUUM CHAMBER

[75] Inventors: Donald E. Routh; Gian C. Sharma, both of Huntsville, Ala.

[73] Assignee: The United States of America as represented by the Administrator of the National Aeronautics and Space Administration, Washington, D.C.

[21] Appl. No.: 409,679

[22] Filed: Aug. 19, 1982

[51] Int. Cl.³ .............................................. C23C 15/00
[52] U.S. Cl. .............................................. 204/192 EC
[58] Field of Search .................................. 204/192 EC

[56] References Cited

U.S. PATENT DOCUMENTS 4,164,461 8/1979 Schilling ...................... 204/192 EC
4,351,697 9/1982 Shanefield et al. ................. 156/643

OTHER PUBLICATIONS

W. H. Legat et al, "Application of Sputtering in the Fabrication of Semiconductor Devices," *Solid State Technology*, Dec. 1970, pp. 54–57.

*Primary Examiner*—Aaron Weisstuch
*Attorney, Agent, or Firm*—Leon D. Wofford, Jr.; John R. Manning; Joseph H. Beumer

[57] ABSTRACT

Apparatus and method for sequentially processing multi-level interconnections for microelectronic circuits are disclosed which includes a vacuum system having a vacuum chamber 12 in which wafers 20 are processed on rotating turntables 16 and 18. The vacuum chamber is provided with an RF sputtering system 24 and a DC magnetron sputtering system 28. A gas inlet 34 is provided in the chamber for the introduction of various gases to the vacuum chamber and the creation of various gas plasma during the sputtering steps. The rotating turntables 16, 18 insure that the respective wafers are present under the sputtering guns for an average amount of time such that consistency in sputtering and deposition is achieved. By continuous and sequential processing of the wafers in a common vacuum chamber without removal, the adverse affects of exposure to atmospheric conditions are eliminated providing higher quality circuit contacts and functional device.

7 Claims, 6 Drawing Figures

METHOD FOR SEQUENTIALLY PROCESSING A MULTI-LEVEL INTERCONNECT CIRCUIT IN A VACUUM CHAMBER

ORIGIN OF THE INVENTION

The invention described herein was made in performance of work under a NASA Contract, and is subject to the provisions of Section 305 of the National Aeronautics and Space Act of 1958, Public Law 85-568 (72 Stat. 435, 42 U.S.C. 2457)

BACKGROUND OF THE INVENTION

The invention relates to the processing of wafer devices to form multi-level interconnects for micro-electronic circuits. Typically, the processing of a monolithic integrated circuit includes the step of etching the wafer, removing the photo resist, back sputtering the entire wafer, and then depositing the next layer of interconnect material. Heretofore, the surface cleaning and deposition of the next level of interconnect material have been done in a vacuum chamber while the initial etching step and the photo resist removal steps are done in separate processes and separate vacuum chambers. However, the problem exists that when the wafer is removed from the separate vacuum chambers for the next step in the process, the wafer comes in contact with the atmosphere, which causes problems in oxidation in the first level of interconnect. Furthermore, contamination problems occur when the wafer is exposed to the atmosphere. Particulate matter from the atmosphere will deposit on the surface of the wafer. This particulate matter that has deposited on the surface of the wafer may lead to discontinuities and/or shorts in the next level of interconnect after it has been deposited and defined.

In addition, the processing of integrated circuits in separate steps in separate apparatus requires additional pieces of equipment. It is a longer process because now each process must go through an individual vacuum pump down sequence and bringing back to the normal pressure and then a transfer of the wafers from one piece of equipment to the next and then sequencing through the vacuum system again. Additional time is involved and additional equipment is necessary since each one of these steps must have its own distinct piece of equipment and distinct vacuum chamber associated with it.

Accordingly, an important object of the present invention is to provide a method and system wherein sequential processing of multi-level interconnects in microelectronic circuits may be had without escaping the wafer to the atmosphere during the process.

Still another important object of the present invention is to provide a method and system for processing multi-level interconnects for microelectronic circuits in which the density of the circuit is improved.

Still another important object of the present invention is to provide a method and system for the processing of multi-level interconnects for microelectronic circuits which increases the cleanliness of the wafer and the circuitry being formed thereon in the process to increase the reliability thereof.

SUMMARY OF THE INVENTION

The above objectives are accomplished according to the present invention by providing an apparatus and method whereby the sequential steps of etching the via, removing the photo resist pattern, back sputtering the entire wafer surface to clean the surface, and depositing the next layer of interconnect material are carried out sequentially under common vacuum conditions without exposure to atmospheric conditions during processing. Consistency in the sputtering and depositing processes are achieved by rotating each wafer device under the sputtering guns an average time period.

Since the wafer devices are not subjected to the environment and pickup of the particulate matter that is there, a gain in reliability is achieved because disruption of the interconnect patterns by the particulate matter is not present, and secondly, with the particulate matter eliminated, fine line geometry in extremely fine patterns is made possible. This means that the overall size of the microelectronic device is reduced, facilitating miniaturization.

BRIEF DESCRIPTION OF THE DRAWINGS

The construction designed to carry out the invention will be hereinafter described, together with other features thereof.

The invention will be more readily understood from a reading of the following specification and by reference to the accompanying drawings forming a part thereof, wherein an example of the invention is shown and wherein.

DESCRIPTION OF A PREFERRED EMBODIMENT

Figure 1:
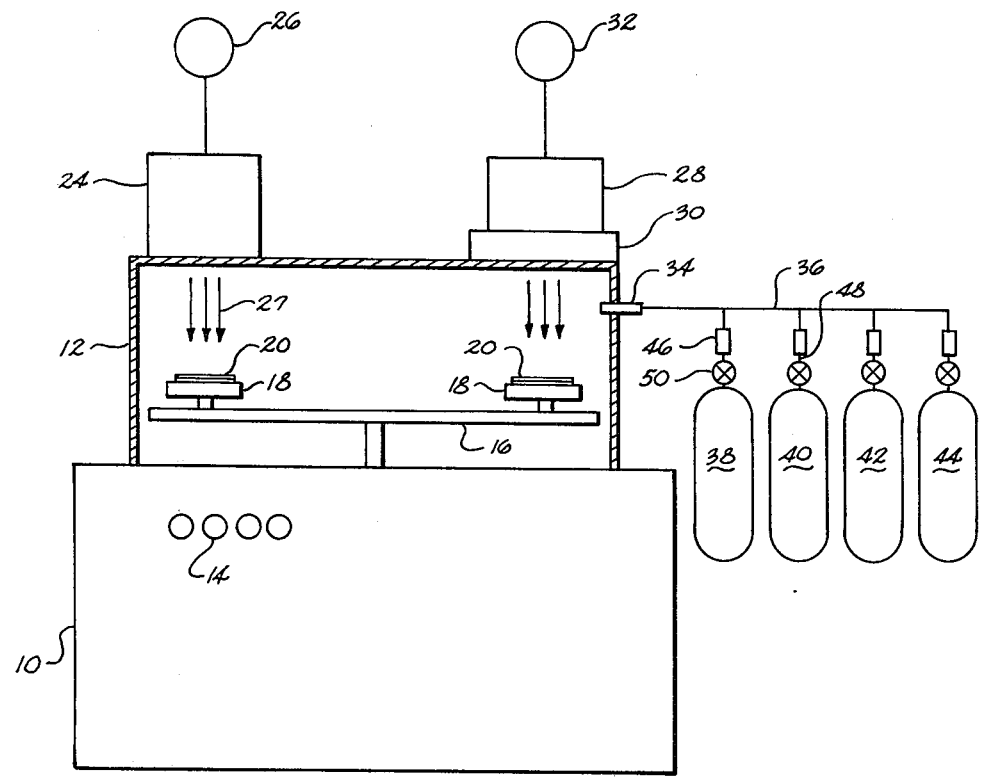
FIG. 1 is a schematic view of apparatus for sequential processing of multi-level interconnections for microelectronic circuits according to the invention.
Figure 2:
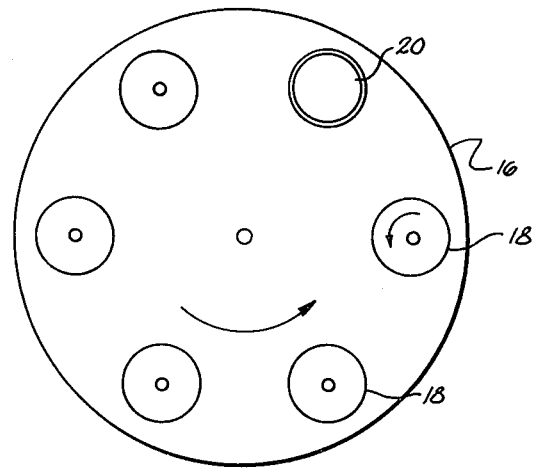
FIG. 2 is a plan view of the vacuum and wafer turntables of the apparatus of FIG. 1.

Referring now in more detail to the drawings, apparatus is illustrated for sequentially processing multi-level interconnections for microelectronics under continuous vacuum conditions, which includes a vacuum system 10 having a vacuum chamber 12. The vacuum system 10 may be any suitable vacuum system such as an NRC 3176 vacuum system manufactured by the National Research Corporation of Newton, Mass. The system typically includes a vacuum pump and suitable controls 14 for pumping down and evacuating the vacuum chamber 12. Inside the vacuum chamber is a vacuum chamber turntable 16 having a plurality of wafer turntables 18 carried thereon. The vacuum turntable 16 rotates in a direction indicated by an arrow and the individual wafer turntables 18 rotate as indicated by an arrow. Each individual wafer turntable 18 supports a silicon wafer 20 for processing. The turntable 16 rotates each turntable 18 in axial sputtering alignment under each sputtering means to present and rotate the wafer device carried thereon under each sputtering means an approximately equal amount of time. Any suitable drive arrangement may be utilized for rotating the various turntables at desired speeds and synchronizations.

Carried atop the vacuum chamber 12 is an RF sputtering system which includes an RF sputtering gun 24 driven by an RF power source 26. The sputtering gun 24 is arranged such that the gun magnet directs a plasma 27 toward the surface of the wafer 20 positioned on a turntable therebelow. The sputtering system may be any suitable conventional sputtering system such as a HFS-500E Sloan RF sputtering system manufactured by the Varian Corporation of Palo Alto, Ca. However, a preferred system is a Microtech 747, three inch reative ion milling system manufactured by Veeco Instruments, Inc. of Arlington Heights, Ill., due to its speed and ability to stop when the insulating layer has been etched through to the metal surface.

Carried on an opposing side of the vacuum chamber 12 is a magnetron sputtering system which includes a magnetron sputtering gun 28 and a conventional target 30 for sputter deposition on the surface of the wafer 20 therebelow. Connected to the sputtering gun 28 is a magnetron sputtering power source 32 for driving the sputtering gun 28. Preferably, a D.C. magnetron sputtering system is utilized at 28 and 32 such as a SPS-300 Sloan D.C. magnetron sputtering system manufactured by The Varian Corporation of Palo Alto, Ca. Thus, RF and magnetron sputtering means are provided in operational proximity in the vacuum chamber for continuous sequential processing. The wafer and vacuum turntables 16, 18 in combination with the arrangement of sputtering means provide processing of multiple microelectronic circuit devices with uniformity and reliability of circuitry.

Also connected to the vacuum chamber is a gas inlet 34 to which a fluid line 36 is connected having individual branches connected to a plurality of individual gas sources for introduction to the vacuum chamber at various steps in the process to be described herein. At 38, a source of oxygen is provided. At 40, a source of helium may be provided, at 42, a freon source may be provided, and at 44, a source of argon gas may be provided. A flow meter 46 is provided in each branch line 48. A pressure regulator 50 is also connected in each branch line in series with the flow meter 46.

Having thus described components of a suitable basic system for carrying out the method of the present invention, a preferred method for sequentially processing multi-level interconnect circuits on a silicon wafer device will now be described. The assembly and integration of the above described components into a single system for continuous processing under common vacuum conditions will be well within the skill of one in the art, having been taught the invention herein.

Figure 3:
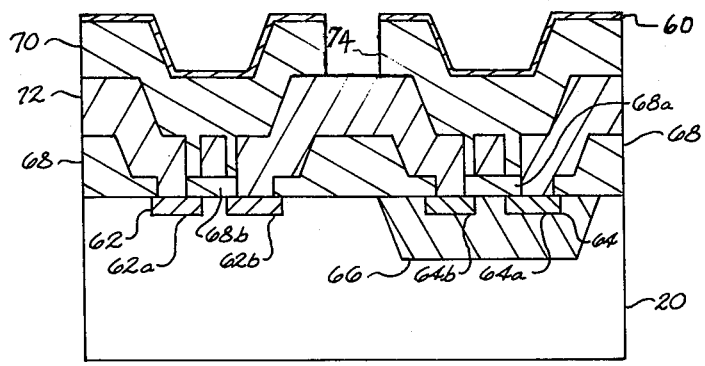
FIG. 3 is a schematic illustration of a multi-level wafer device as processed according to the first step of the invention in a vacuum chamber according to the invention.

In practice, a silicon wafer device 20 has been initially processed to the point of defining a via with a photo resist pattern 60 in a conventional manner (FIG. 3). The device has been processed to define a boron doped P device 62 having a source 62a and a drain 62b as in a conventional MOS device. A phosphorous doped N device 64 is formed having a source 64a and drain 64b in a lightly doped boron P well 66, all of which may be done according to known techniques of MOS devices. The initially processed wafer device includes layers 68 and 70 of a suitable intermetal oxide as an insulator. The layer 68 includes an N channel gate oxide 68a and a P-channel gate oxide 68b. An aluminum/silicon layer 72 has initially been formed which may be a composite of ninety-eight percent aluminum and two percent silicon.

Beginning now with the wafer device 20 as initially processed and defined as described above, the method for sequentially processing the wafer under continuous vacuum conditions to define a multi-level circuit interconnect will be described.

Referring in detail to the drawings, the device of FIG. 3 is processed in a first step of the invention by etching a via 74 utilizing the RF sputtering gun 24 in the vacuum chamber to etch the via through the insulating oxide 70. The via is located over the area that is to be contacted by the new level of interconnect material to be subsequently deposited and provide the means whereby multi-level contact is achieved by the interconnect material. The via is etched through the entire layer of the oxide 70. A preferred method of etching the via is by reactive ion etching since it is faster than ion milling and the etching will selectively stop when the metal surface at layer 72 is reached. During the RF sputtering of the wafer device, a gas mixture of twenty-four percent freon, one percent oxygen, and seventy-five percent helium is introduced into the vacuum chamber. The plasma is directed magnetically at the wafer surface to provide the desired directional etching action in any well known manner. After etching, chamber 12 is pumped down and the gas mixture removed.

Figure 4:
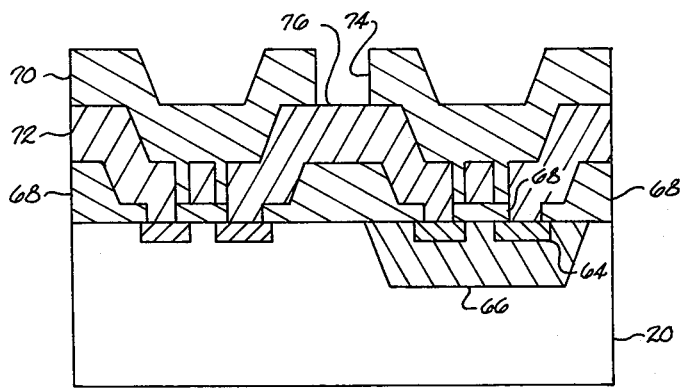
FIG. 4 is a schematic illustration of a multi-level circuit device processed according to a second step in a vacuum chamber according to the invention.

In accordance with the second step of the invention, the remaining photo resist layer 60 is now stripped from the wafer device by introducing oxygen into the chamber and utilizing the RF sputtering gun to create an oxygen plasma which is directed onto the wafer. In so doing, aluminum oxide is developed at 76 (FIG. 4) at the bottom of the via 74 and must be removed. The oxygen gas is then evacuated from chamber 12.

Figure 5:
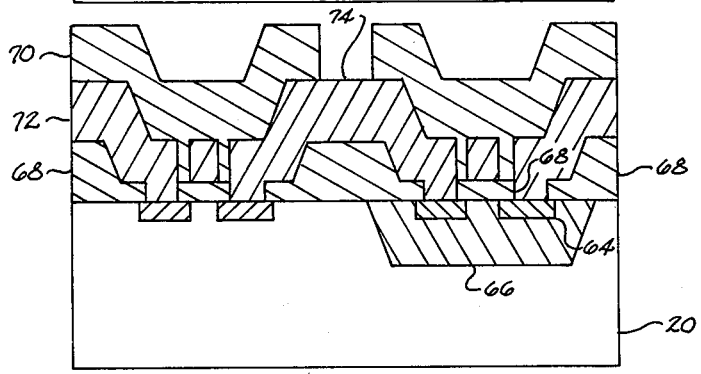
FIG. 5 is a schematic illustration of a multi-level circuit device processed according to a third step in a vacuum chamber according to the invention.

In accordance with the third step of the invention, after the oxygen is removed, argon is introduced into the vacuum chamber to take the place of the oxygen. The RF sputtering gun is energized to create an ionized argon plasma which is directed at the wafer surface, which will clean the entire surface and remove the aluminum oxide at the bottom of the via (FIG. 5). This insures good contact between the interconnects. The plasma is then stopped after all of the aluminum oxide has been removed from the via and the argon gas is removed from the system by the vacuum pump.

Figure 6:
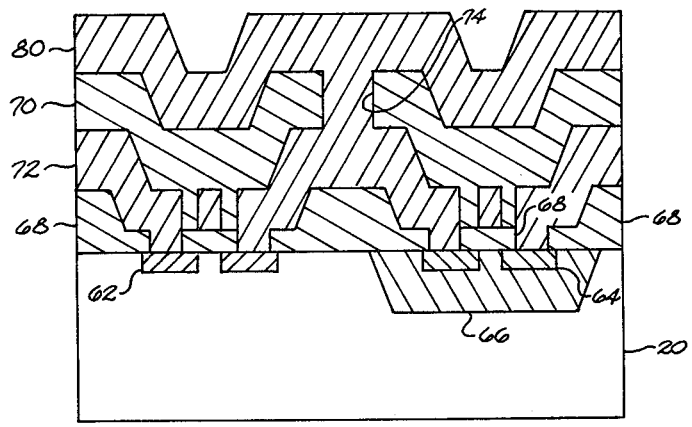
FIG. 6 is a schematic illustration of a multi-level circuit device in which the final interconnecting metal layer has been deposited to the device in a vacuum according to the invention.

In the fourth and final step, the next level of interconnect material is deposited on the wafer while the wafer is continuously maintained in the vacuum chamber 12. In this step, the RF sputtering power source is shut down and the power source for the DC magnetron sputtering system is turned on. In step 4, a layer 80 (FIG. 6) of interconnect material, such as 98% aluminum and 2% silicon, is deposited from target 30 of the magnetron system onto the wafer device 20, whereby an interconnect is made in the via 74 to connect the two intermetal layers 80 and 72.

The wafer device 20 is now ready to be removed from the vacuum chamber. It will be noted that the rotation of the wafer turntable 16 under the center of the sputtering guns 24 and 28 assures that the individual wafer devices are under the center of the gun for the same average amount of time during sputtering and deposition to provide for consistency of etching and deposition of the final interconnect material. In this way, quality and uniformity in the deposition of the interconnect metal level is achieved. All four steps of the present invention are achieved by placing the wafer under a vacuum and processing the wafers in the same vacuum chamber until all four steps have been completed and before the wafers are subjected to the atmospheric conditions, whereby better quality circuit contacts and functional devices are provided. Cost savings are achieved by reducing production costs and equipment costs.

While a preferred embodiment of the invention has been described using specific terms, such description is for illustrative purposes only, and it is to be understood that changes and variations may be made without departing from the spirit or scope of the following claims.

What is claimed is:

1. A method for processing multi-level interconnections for microelectronic circuits comprising:
    providing a processed wafer device having a first metal contact layer, an insulating layer over said metal contact layer, and a photo resist pattern applied over said insulating layer defining a via to be formed in a subsequent step;
    providing a vacuum chamber;
    providing an RF sputtering means and DC mangetron sputtering means arranged in operable position for sputtering in said vacuum chamber;
    placing said processed wafer device in said chamber and sequentially performing the following steps in said vacuum chamber without exposure to the atmosphere;
    forming said via by etching through said insulating layer of the wafer device according to said photo resist pattern by means of RF sputtering;
    removing any remaining photo resist on said wafer device by utilizing RF sputtering while said wafer device remains continuously in said vacuum chamber;
    cleaning said wafer device and removing remaining oxide from the wafer device after removing the photo resist by sputtering said wafer device with said RF sputtering means while said wafer device is continously processed in said vacuum chamber; and
    depositing a layer of interconnect material on the wafer device in place while continuously in said vacuum chamber by means of magnetron sputtering, thereby filling said via to make electrical connection with said metal contact layer.

2. The method of claim 1 including providing a gas mixture of freon, oxygen, and helium in said vacuum chamber to create a gas plasma directed at the wafer surface during said RF sputtering for etching of said via.

3. The method of claim 1 wherein said etching of said vias is accomplished by utilizing reactive ion etching.

4. The method of claim 1 including the step of removing the gas mixture utilized in the via etching prior to removing the photo resist and replacing the gas mixture with oxygen gas, whereby an oxygen plasma is created during said removal step.

5. The method of claim 1 wherein argon gas is introduced into the vacuum chamber prior to back sputtering the wafer device for cleaning.

6. The method of claim 1 including carrying said wafer device on a first turntable device which rotates in axial alignment with said sputtering means and carrying said first turntable on a second turntable which rotates said first turntable and wafer device selectively under each said sputtering means.

7. The method of claim 6 including a plurality of said first turntables carried on said second turntables for processing a plurality of said wafer devices simultaneously and rotating each said wafer device under said sputtering means a generally equal amount of time for uniformity in processing.

* * * * *